United States Patent
Hwang et al.

(10) Patent No.: US 6,680,478 B2
(45) Date of Patent: Jan. 20, 2004

(54) FABRICATION OF AMORPHOUS SILICON/ AMORPHOUS SILICON GERMANIUM $NI_1PI_2N$ INFRARED POSITION DETECTORS

(75) Inventors: Huey-Liang Hwang, Hsinchu (TW); Yeu-Long Jiang, Tuichung (TW); Klaus Yung-Jane Hsu, Hsinchu (TW); Cho-Jen Tsai, Hsinchu (TW)

(73) Assignee: National Science Council, Taipei (TW)

( * ) Notice: Subject to any disclaimer, the term of this patent is extended or adjusted under 35 U.S.C. 154(b) by 103 days.

(21) Appl. No.: 10/021,011

(22) Filed: Dec. 19, 2001

(65) Prior Publication Data

US 2003/0020018 A1 Jan. 30, 2003

(30) Foreign Application Priority Data

Jan. 19, 2001 (TW) .......................... 90101602 A

(51) Int. Cl.[7] .................................. G01J 5/20
(52) U.S. Cl. ...................... 250/338.4; 438/96
(58) Field of Search ............... 250/338.4, 339.05, 250/370.14; 438/57, 63, 96

(56) References Cited

U.S. PATENT DOCUMENTS

| | | | | |
|---|---|---|---|---|
| 4,785,186 A | * | 11/1988 | Street et al. | 250/370.14 |
| 4,881,979 A | * | 11/1989 | Lewis | 438/87 |
| 5,589,688 A | * | 12/1996 | Kimura et al. | 250/338.4 |
| 6,169,284 B1 | * | 1/2001 | Caputo et al. | 250/338.4 |
| 6,323,059 B1 | * | 11/2001 | Yoshida et al. | 438/106 |

* cited by examiner

*Primary Examiner*—G. Bradley Bennett
(74) *Attorney, Agent, or Firm*—Robert E. Bushnell, Esq.

(57) ABSTRACT

Amorphous silicon/amorphous silicon germanium NI1PI2N position detectors are fabricated to suppress visible light and increase detection of infrared light. The material of I1 layer is amorphous silicon or amorphous silicon germanium used to absorb visible light, and material of I2 layer is amorphous silicon germanium or amorphous germanium used to absorb infrared light. A suppression of signal due to the absorption of the visible light and amplification of signals due to absorption of the infrared light can be obtained when the NI1P diode is forward biased and the PI2N diode is reverse biased. The optical band gap of the I1 and I2 layers can be controlled by the Si/Ge atomic ratio. The suppression of visible light and enhanced detection of infrared light may be tuned by controlling thickness and optical band gaps of the I1 and I2 layers. The amorphous silicon and amorphous silicon germanium layers may be deposited by square-wave modulation at 13.56 MHz.

6 Claims, 9 Drawing Sheets

FABRICATION OF AMORPHOUS SILICON/ AMORPHOUS SILICON GERMANIUM $NI_1PI_2N$ INFRARED POSITION DETECTORS

FIELD OF THE INVENTION

This invention discloses amorphous silicon/amorphous silicon-germanium $NI_1PI_2N$ used in infrared position detectors, and light-pen based digital boards.

BACKGROUND OF THE INVENTION

Infrared position detectors currently on the market, primarily consist of PIN diodes made from crystalline silicon. The structure of such detectors is designed chiefly for one-dimensional detection. Infrared detectors built with amorphous silicon or amorphous silicon-germanium alloy, have only a single detection function, detecting infrared, but not position. In 1991, L. C. Kuo et al. used a relatively thicker I layer as the absorption layer to detect infrared light (Materials Research Society Proc. Vol. 219, pp.783–789, 1991). In 1990, JYH-Wong Hong et al. put forward the Avalanche photo diode for use in infrared detectors (IEEE Quantum Electronics, Vol.26, No.2, pp.280–284, 1990). The Avalanche photo diode increases the detection efficiency of the infrared signal using a large reverse bias.

C. Y. Chen et al. suggested that in $NI_1PI_2N$ infrared detector, the first NIP diode absorbs infrared light, and the second PIN diode amplifies the signal. (Appl. Phys. Lett. Vol.39, No.4, pp.340–342, 1981).

Although the aforementioned structure of infrared detectors can be used for visible light, using a crystalline silicon PIN to absorb infrared light, neither supports two-dimensional large-scale position detection, nor effectively prohibits visible light signals from being absorbed.

The infrared detectors that include an amorphous silicon-germanium alloy PINs, designed by L. C. Kuo et al., failed to prohibit visible light absorption and leading to inefficient detection. The Avalanche photo diode put forward by JYH-Wong Hong et al., generates an amplified Avalanche signal under a large reverse bias, can not prohibit visible light from absorption either. Despite possessing a structure similar to that of this invention, the $NI_1PI_2N$ structure suggested by C. Y. Chen et al, follows a different principle and can not prohibit visible light from: absorption, because the front $NI_1P$ diode absorbs infrared light, whereas the rear diode $PI_2N$ amplifies the signal.

SUMMARY OF THE INVENTION

The primary purpose of the invention is to disclose the amorphous silicon/amorphous silicon-germanium $NI_1P_2N$ used for infrared position detection. The material of the $I_1$ layer absorbs visible light, and $I_2$ layer absorbs infrared light. The suppression of the signal due to the absorption of the visible light and the increase in the signal due to the absorption of the infrared light, can be obtained by a $NI_1P$ diode under forward bias and the $PI_2N$ diode under reverse bias.

The second purpose of the invention is to disclose the manufacture method of amorphous silicon-germanium alloy. It is produced by modulating RF plasma with a square wave pulse and diluting hydrogen.

The invention can be modified in a number of ways. Illustrative examples are presented.

BRIEF DESCRIPTION OF THE DRAWINGS

The invention is described with reference to the accompanying Tables and Figures.

Table 1 specifies the conditions for developing the $NI_1PI_2N$ detector.

1. ■ . . . Id 2. ● . . . 450 nm 3. ▲ . . . 550 nm

4. ▼ . . . 650 nm 5. ♦ . . . 694 nm 6. * . . . 780 nm

Figure 4:
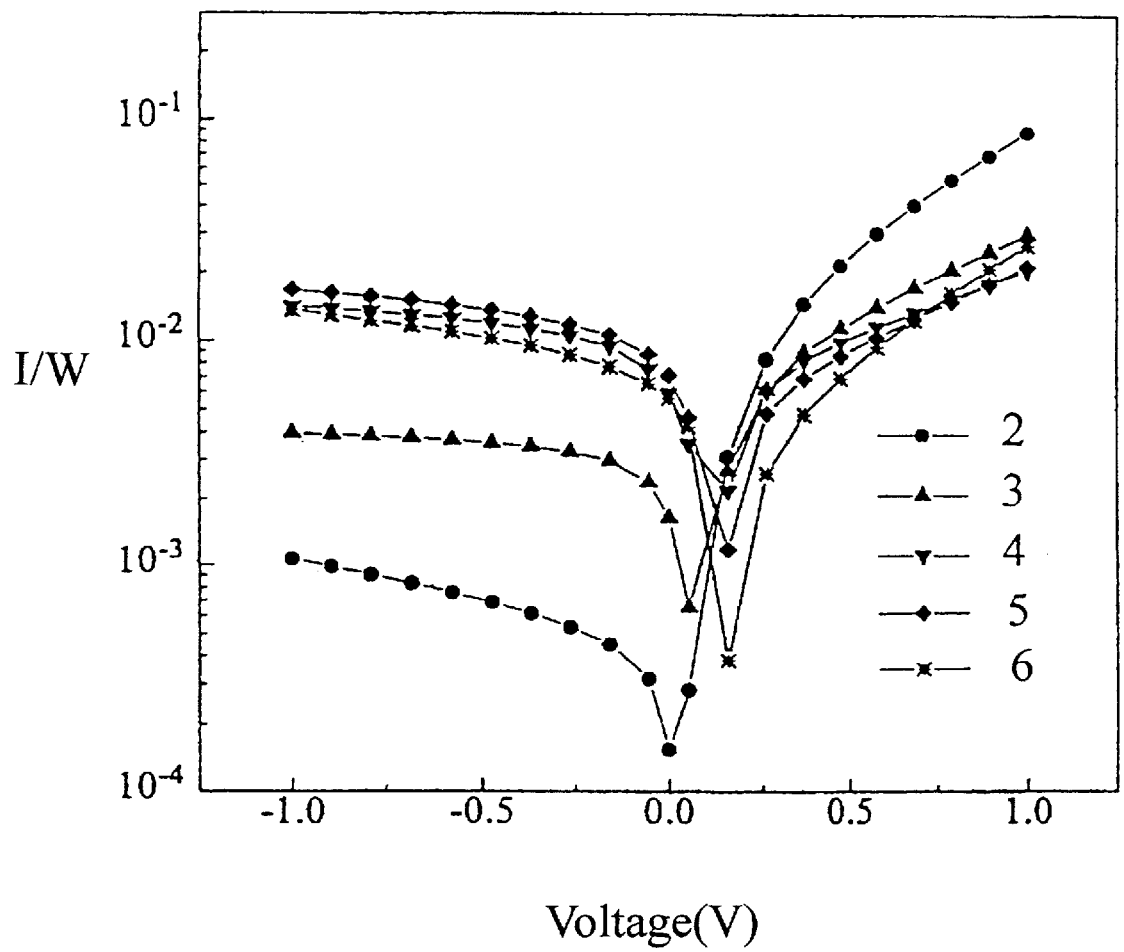

FIG. 4 is the I/W-V chart of the detector. ($I_1$ is 800 Å thick, and its energy gap is 1.42 eV)

2. ● . . . 450 nm 3. ▲ . . . 550 nm 4. ▼ . . . 650 nm

5. ♦ . . . 694 nm 6. * . . . 780 nm

Figure 5:
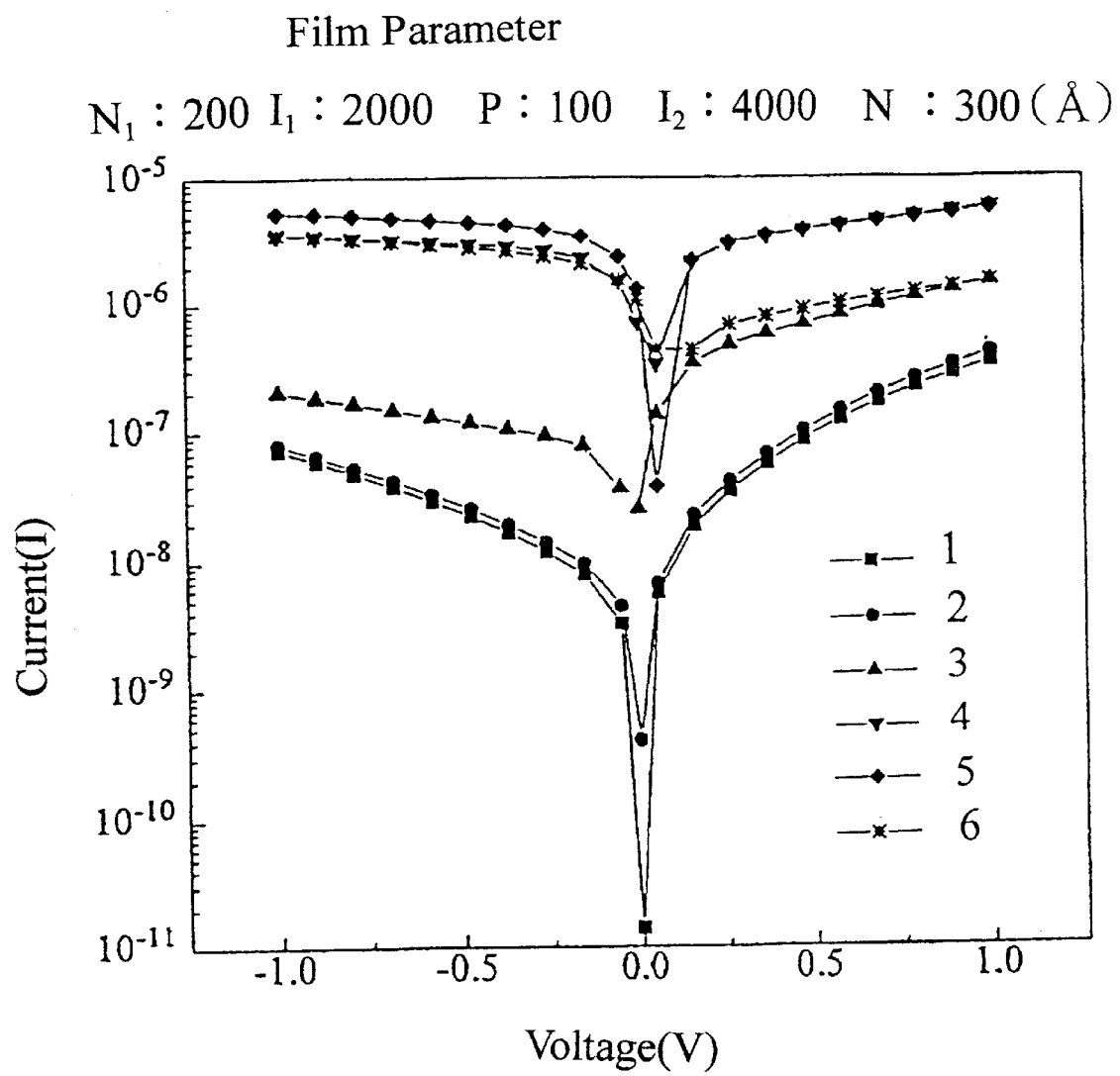

FIG. 5 is the I/V chart of the detector. ($I_1$ is 2,000 Å thick, and its energy gap is 1.42 eV)

1. ■ . . . Id 2. ● . . . 450 nm 3. ▲ . . . 550 nm

4. ▼ . . . 650 nm 5. ♦ . . . 694 nm 6. * . . . 780 nm

Figure 6:
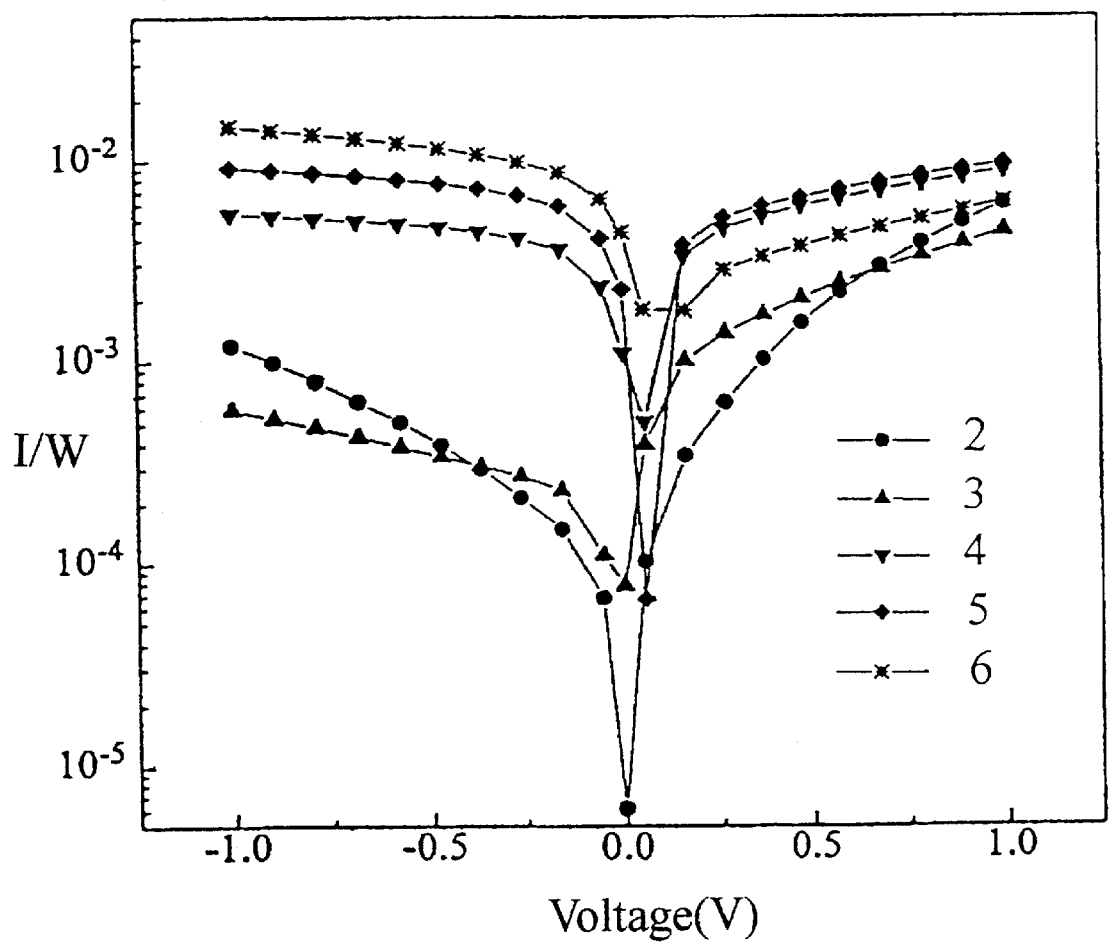

FIG. 6 is the I/W-V chart of the detector. ($I_1$ is 2,000 Å thick, and its energy gap is 1.42 eV)

2. ● . . . 450 nm 3. ▲ . . . 550 nm 4. ▼ . . . 650 nm

5. ♦ . . . 694 nm 6. * . . . 780 nm

Figure 7:
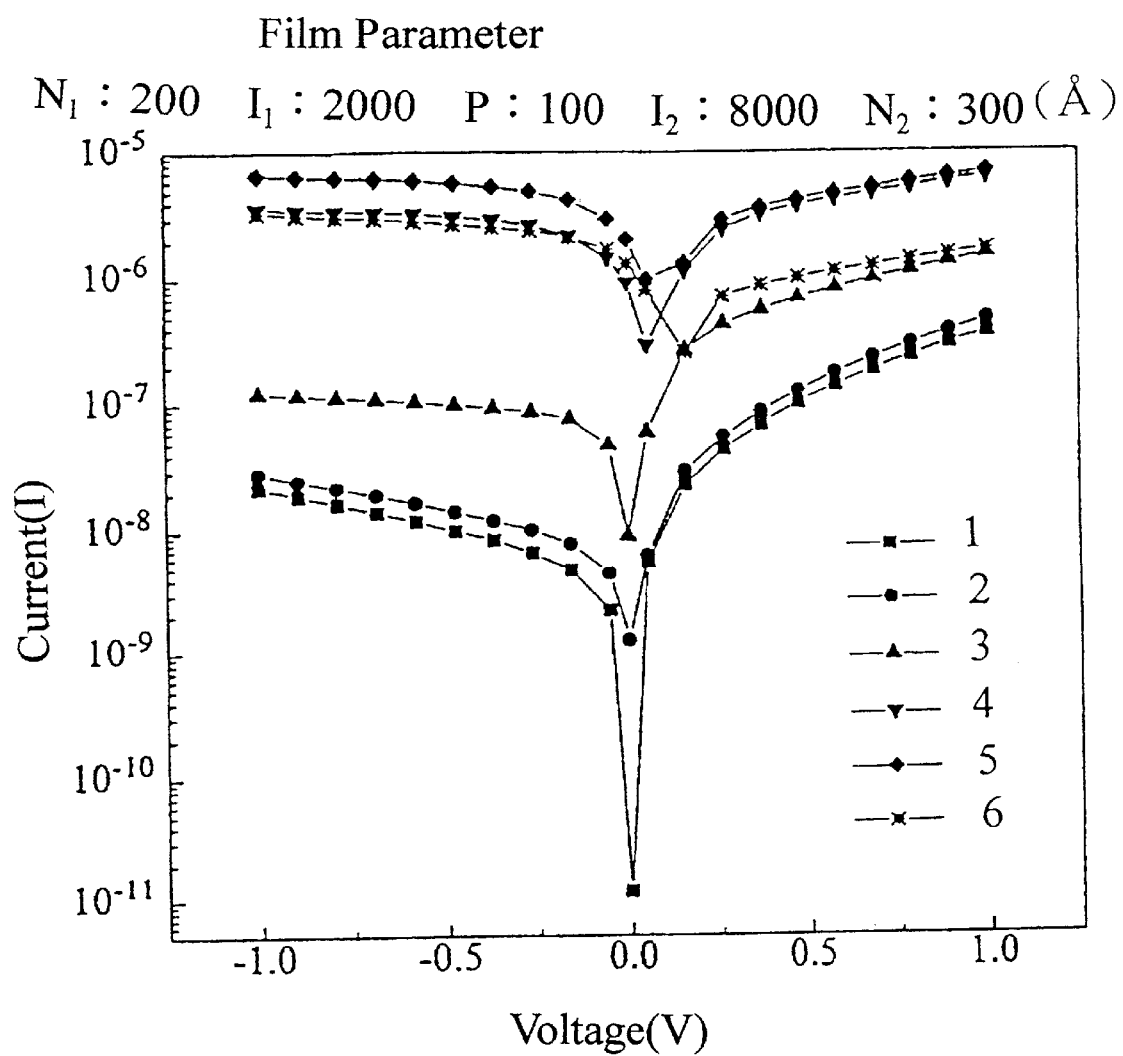

FIG. 7 is the I/V chart of the detector. ($I_1$ is 2,000 Å thick; $I_2$ is 8,000 Å thick)

1. ■ . . . Id 2. ● . . . 450 nm 3. ▲ . . . 550 nm

4. ▼ . . . 650 nm 5. ♦ . . . 694 nm 6. * . . . 780 nm

Figure 8:
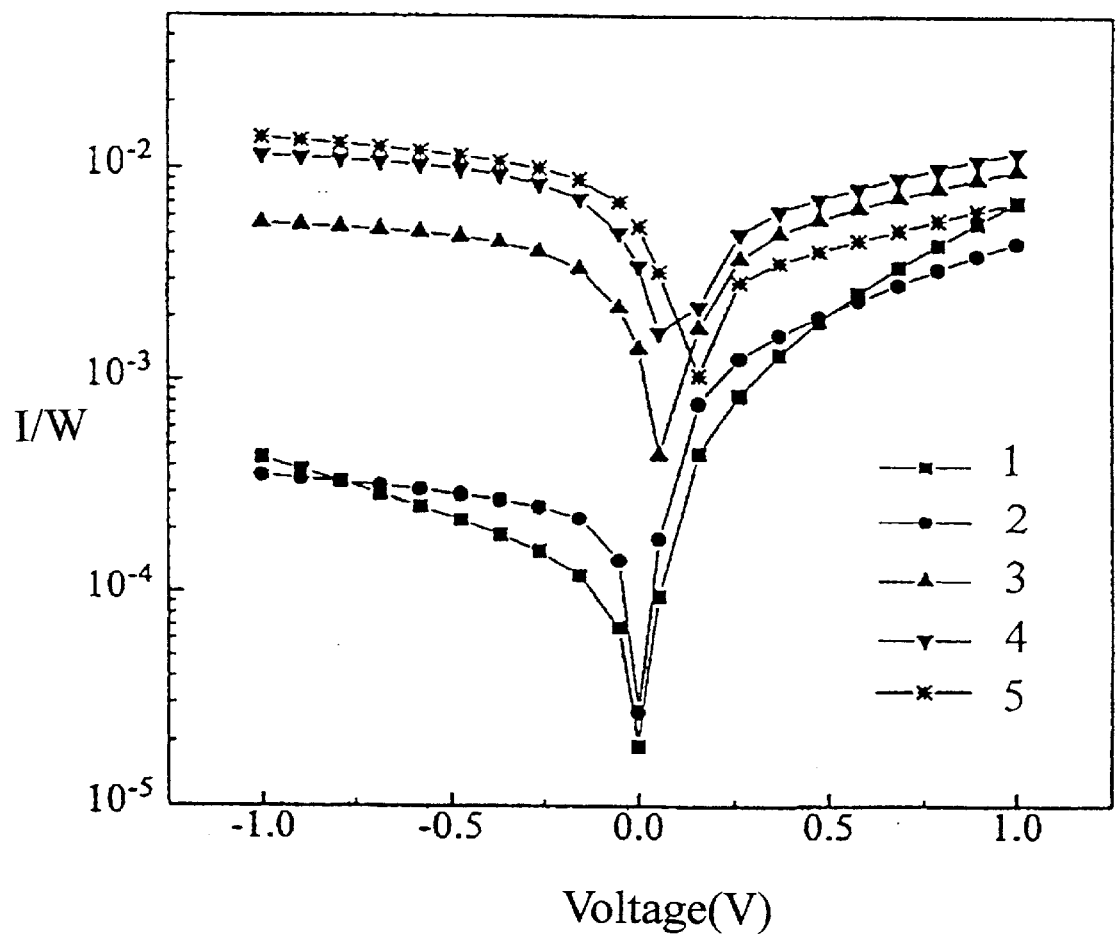

FIG. 8 is the I/W-V chart of the detector. ($I_1$ is 2,000 Å thick; $I_2$ is 8,000 Å thick)

1. ■ . . . 450 nm 2. ● . . . 550 nm 3. ▲ . . . 650 nm

4. ▼ . . . 694 nm 5. * . . . 780 nm

Figure 9:
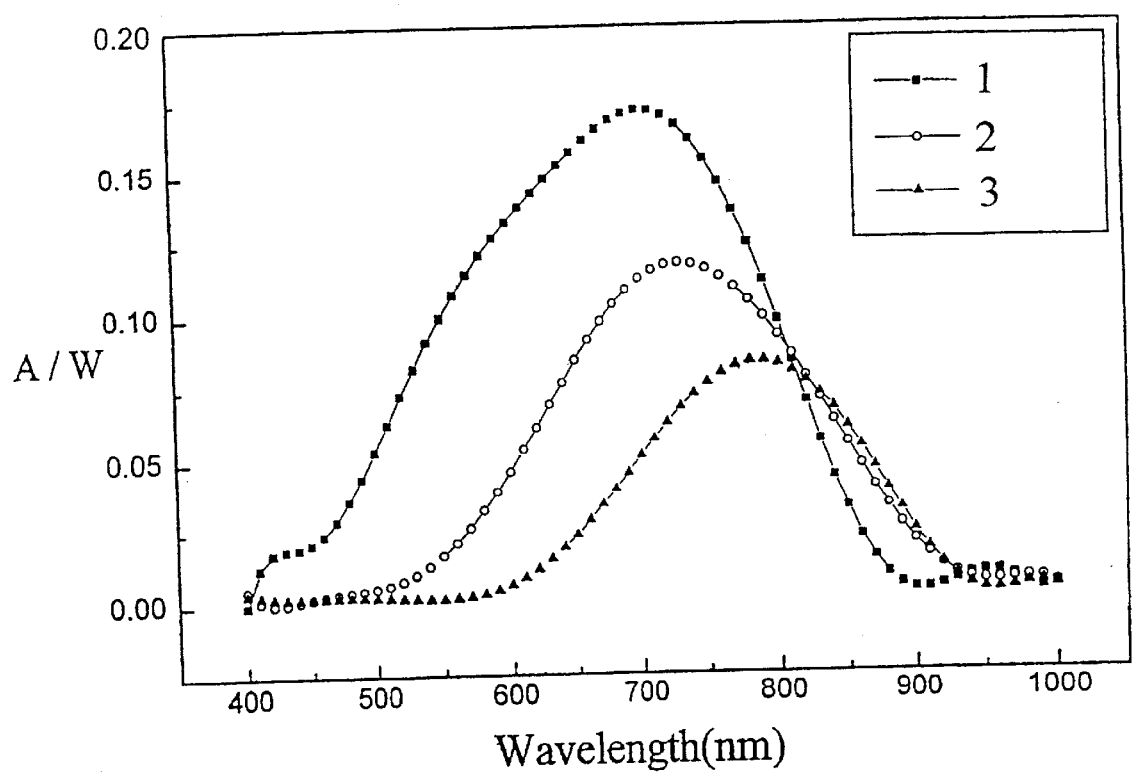

FIG. 9: Spectrum of $NI_1PI_2N$

1. ■ . . . $I_1$ is 200 Å thick 2. ○ . . . $I_1$ is 800 Å thick

3. ▲ . . . $I_1$ is 2,000 Å thick

REFERENCE NUMBERS OF THE ATTACHED DRAWINGS

101 . . . $N_1$: 200 Å

102 . . . $I_1$: 200~2000 Å (1.42 eV or 1.65 eV)

103 . . . P: 100 Å

104 . . . $I_2$: 4000~8000 Å (1.42 eV)

105 . . . $N_2$: 300 Å

106 . . . Al

107 . . . ITO(2)

108 . . . ITO(1)

201 . . . $NI_1PI_2N$

202 . . . glass substrate

203 . . . resistance layer

DETAILED DESCRIPTION OF THE INVENTION

This invention discloses the amorphous silicon/amorphous silicon-germanium infrared position detector used for infrared light-pen based digital boards. The structure of the boards involves many materials to support 2-dimensional position detection. As presented in FIG. 1, the position detector featured with glass/ITO(1)/$NI_1PI_2N$/ITO (2)/Al. A light-penetrating conductible membrane ITO(1) is built on the glass as an infra-resistance layer, and a supra-resistance layer ITO(2) is built on the $NI_1PI_2N$. Two aluminum (Al) electrodes are applied on both the ITO layer of the infra-resistance layer and that of the supra-resistance layer. These contact electrodes are mutually orthogonal to one another. The Al electrodes yield 2-dimensional position with respect to the x-axis and the y-axis.

Figure 2:
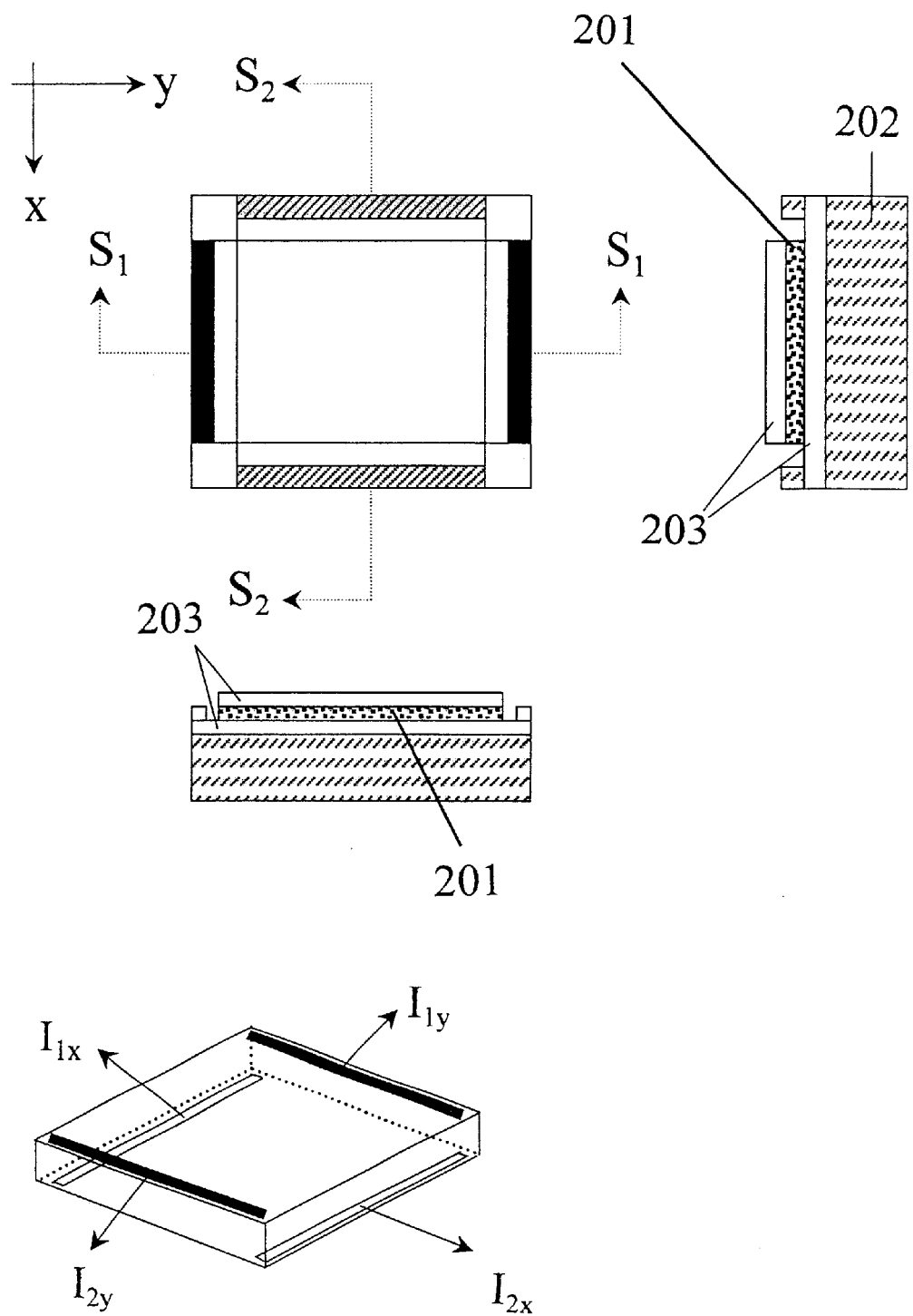
FIG. 2 shows the front and lateral views of the detector

FIG. 2 shows the front and lateral views of the detector. The N layer is 200~300 Å thick; the $I_1$ layer is 200~2,000

Å thick, with an energy gap of 1.42 eV or 1.65 eV; the P layer is 100 Å thick, and the $I_2$ layer is 4,000~8,000 Å thick, with an energy gap of 1.42 eV. Many materials are used in the supra-resistance layer and the infra-resistance layer., from which materials such as ITO, TO, μc-Si and poly-Si, can be selected.

The aforementioned $NI_1PI_2N$ of five amorphous silicon/amorphous silicon-germanium layers, consists of front diodes of $NI_1P$ that absorb visible light and rear diodes of $PI_2N$ that absorb infrared light. The N layers are made from either phosphorus-doped hydrogenated amorphous silicon or from hydrogenated amorphous silicon germanium alloy. The P layers are made from either boron-doped hydrogenated amorphous silicon or from hydrogenated amorphous silicon-germanium alloy. The $I_1$ layers are made from either undoped hydrogenated amorphous silicon or from hydrogenated amorphous silicon-germanium alloy. The $I_2$ layers are made from either undoped hydrogenated amorphous silicon-germanium alloy or from hydrogenated amorphous germanium. The signal can be suppressed by the absorption of visible light and increased by the absorption of infrared light when the front diode is forward biased and the rear diode is under reverse bias.

The $I_1$ layer uses amorphous silicon or amorphous silicon-germanium to absorb visible light, and the $I_2$ layer uses amorphous silicon-germanium or amorphous germanium to absorb infrared light. The efficiency of the suppression of visible light and the detection of infrared signal are enhanced when the $NI_1P$ diode is forward biased and the $PI_2N$ diode is reverse biased.

This 2-dimensional position detector includes two resistance layers—the supra-resistance layer and the infra-resistance layer, embedded in the structure of the glass/infra-resistance layer/$NI_1PI_2N$/supra-resistance, in which when the $NI_1P$ diode is forward biased and the $PI_2N$ diode is under reverse bias. The infrared 2-dimensional detector is responsible for prohibiting visible light from absorption and detecting infrared signal. The detection is continuous, requiring no complicated 2-dimensional array.

The manufacture of $NI_1PI_2N$ infrared detectors involves the following steps. First, deposit a conductible resistance membrane on a glass base. Then, deposit various layers, such as N, $I_1$, P, $I_2$ and N by modulating the RF plasma or continuous RF plasma with a pulsing square wave. A supra-electrode layer is finally deposited.

Another method for forming glass/infra-resistance layer/$NI_1PI_2N$/supra-resistance layer is as follows. First, deposit an infra-resistance layer on the glass base, and then deposit a layer of conductible resistance membrane. Deposit various layers such as N, $I_1$, P, $I_2$ and N, including a supra-electrode layer, by modulating RF plasma or continuous RF plasma with a pulsing square wave. Then, deposit a supra-electrode layer. Finally, form conductors for the supra-electrode and the infra-electrode by photoetching. The materials used for the conductors of the supra-eletrode and the infra-electrode include Al, Ti, Ag epoxy and conductive glue.

Table 1 lists the conditions for developing $NI_1PI_2N$ infrared detectors. RF plasma is employed to deposit the N layer under conditions of 0.75 torr, 250° C.; an $SiH_4$ flow rate of 30 sccm, an $H_2$ flow rate of 75 sccm, a $PH_3$ rate of 30 sccm; a power of 25W, and a growth rate of 167 Å/min.

RF plasma is employed deposit to a-SiGe:H layer:under 0.75 torr, 250° C.; an $SiH_4$ flow rate of 18 sccm, an $H_2$ flow rate of 130 sccm, a $GeH_4$ flow rate of 2 sccm, power of 25W, and a growth rate of 176 Å/min.

RF plasma is employed to deposit a-SiGe:H layer under: 0.75 torr, 250° C.; an $SiH_4$ flow rate of 8 sccm, an $H_2$ flow rate of 140 sccm, a $GeH_4$ flow rate of 2 sccm, a power of 25 W (500 Hz), and a growth rate of 32 Å/min.

RF plasma is employed to deposit a-SiH layer: under 0.75 torr, 250° C.; an $SiH_4$ flow rate of 50 sccm, an $H_2$ flow rate of 200 sccm, a $B_2H_6$ flow rate of 200 sccm; a power of 25W, and a growth rate of 218 Å/min.

Figure 3:
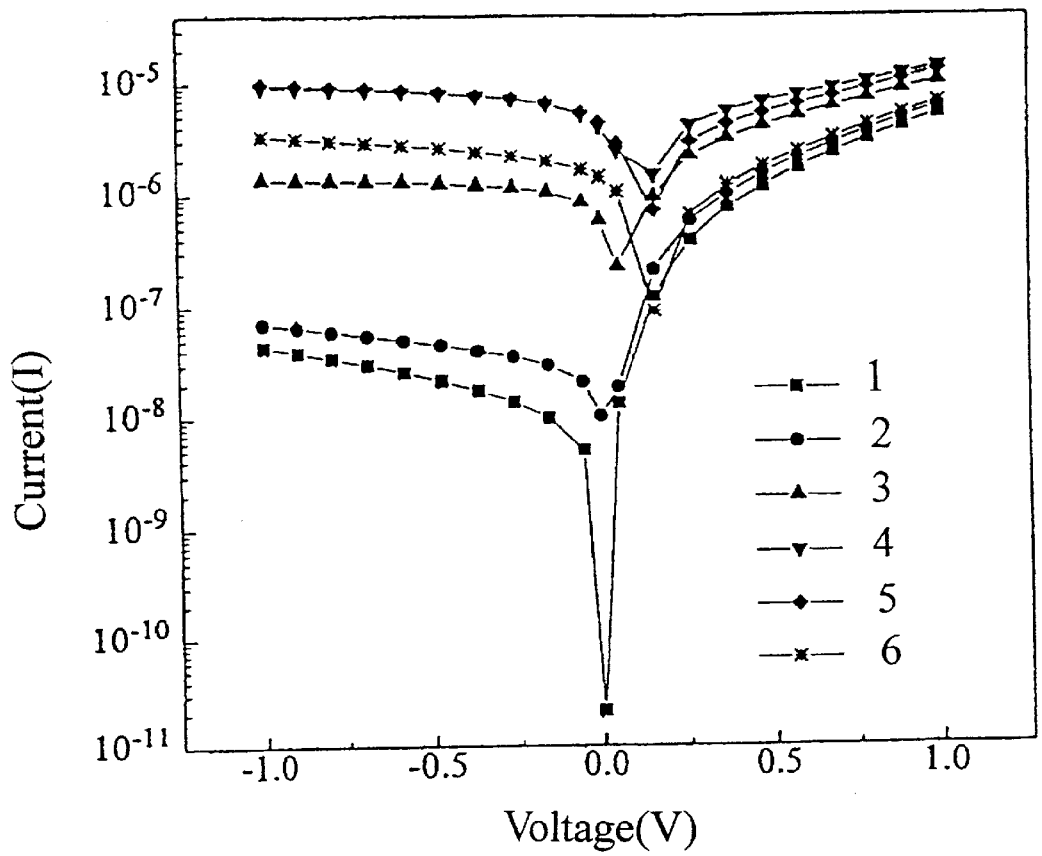
FIG. 3 is the I-V chart of the detector. ($I_1$ is 800 Å thick, and its energy gap is 1.42 eV)

$NI_1PI_2N$ infrared detectors are produced by modulating RF plasma with a square wave pulse and the diluting hydrogen, $NI_1PI_2N$ infrared detectors accordingly include two diodes, such as $NI_1P$ and $PI_2N$. $NI_1P_2N$ infrared detectors selectively absorb visible and infrared light: the front diode, $NI_1P$, absorbs visible light and the rear diode, $PI_2N$, absorbs infrared. The light source includes both visible and infrared wavelengths. Infrared light can pass through the first diode and arrive at the second diode when the light source irradiate on surface of the $NI_1PI_2N$ infrared detector. The efficiency of prohibiting visible light from absorption and detecting infrared signal are increased when the front diodes $NI_1P$ is forward bised and the rear diode $PI_2N$ is under reverse bias. As shown in FIGS. 3 and 7, the $I_1$ layer is 800~2,000 Å thick, with an energy gap of 1.42 eV; the light source is a wavelength of 780 nmLED, and under a reverse bias of −0.5V, the ratio of the photo-electric current to the dark-electric current exceeds 100.

Figure 1:
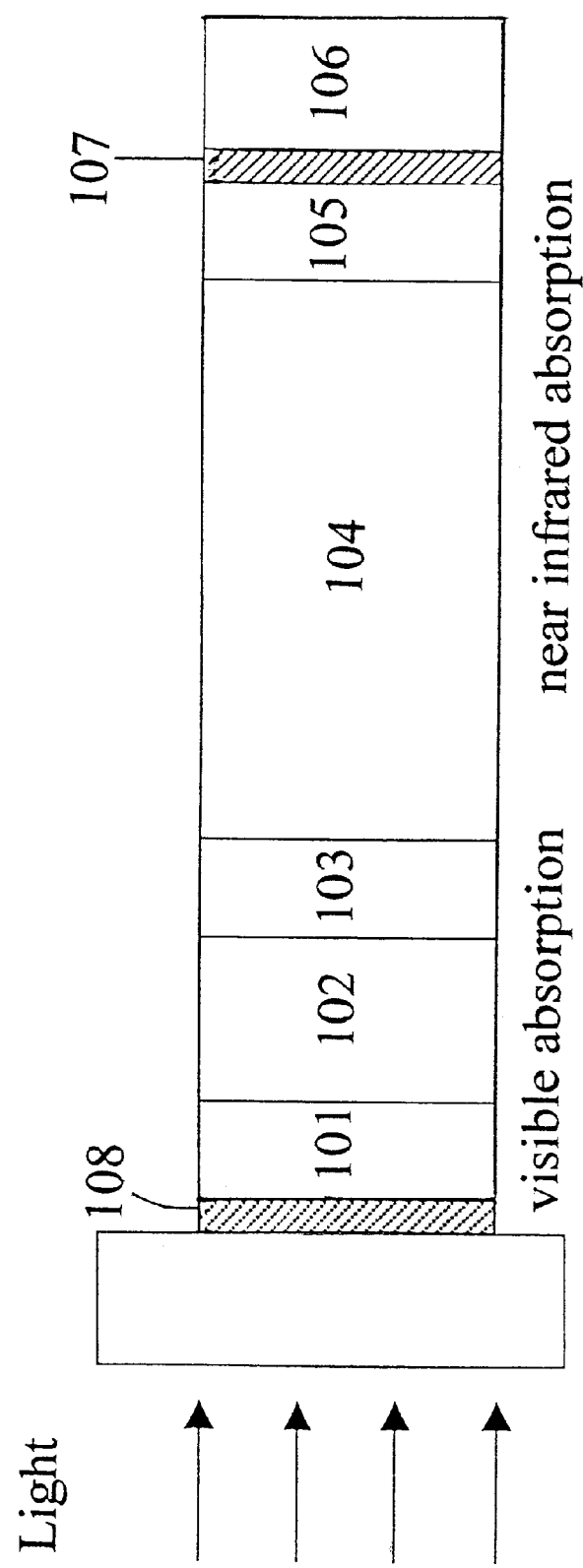
FIG. 1 shows the structural diagram of $NI_1PI_2N$

FIG. 1 illustrates the structure of the position detector; that is glass/infra-resistance layer ITO(1)/$NI_1PI_2N$/supra-resistance layer ITO(2)/Al. A light-penetrating conductible membrane ITO(1) infra-resistance layer is built on the glass, and a supra-resistance layer ITO(2) is built on the $NI_1PI_2N$. Two aluminum (Al) electrodes are deposited on both the ITO layer of the infra-resistance layer and the supra-resistance layer, the two electrodes are mutually perpendicular to one another. The Al electrodes yield a 2-dimensional position with respect to the x-axis and the y-axis. FIG. 2 presents the front and lateral views of the detector. Table 1 specifies the conditions for the development of this $NI_1PI_2N$ detector.

The creative features of this invention are as follows.
(1) a.—$I_1$ and $I_2$ are made either from undoped hydrogenated amorphous silicon or from hydrogenated amorphous silicon-germanium alloy. The energy gap of $I_1$ can be adjusted by altering the microstructure of the amorphous silicon. The range of the adjustment is 1.5 eV-1.8 eV: If amorphous silicon-germanium alloy is used, the energy gap can be adjusted within a range of 1.1 eV-1.8 eV by changing the amount of incorporated germanium present.

The energy gap of $I_2$ can be adjusted in the same way. The energy gap of $I_2$ generally does not exceed $I_1$, to suppress visible light and detect infrared signal, and the overall adjustment targets mainly the peak values as-indicated by the spectrum. A large $I_1$ energy gap does not significantly impact the absorption of infrared light.

b—In the $N_1I_1P$ region, the infrared light does not greatly decay.

c—The spectrum echo diagram of the objects in FIG. 9 determines primarily the I-V curves of FIGS. 3 and 5 in which $I_d$ denotes dark current, and the remaining currents are monochromic photoelectric currents with wavelengths at 450 nm, 550 nm, 650 nm, 694 nm and 780 nm: The film parameter $N_1$ is 200 Å; $I_1$ is 800 Å; P is 100 Å; $I_2$ is 4,000 Å, and $N_2$ is 300 Å.

(2) The first diode $N_1I_1P$ is designed to prohibit visible light, and $PI_2N$ is designed to detect infrared light. This invention is significantly different from the $NI_1PI_2N$ designed by C. Y. Chen. et al in 1981, with respect to the design concept and the purpose are concerned. The latter employs one of the diodes for photo-amplification.

(3) The energy gap of $I_1$ is typically not less than that of $I_2$. "Thickness" does not considerably affect infrared absorption.

(4) Infrared signal can be absorbed by the $I_2$ layer, after penetrating $N_1I_1P$, because the energy gaps of the various layers of $N_1I_1P$ layers are greater than that of the $I_2$ layer (>1.4 eV) such that infrared signal seldom decays in the $I_1$ layer.

FIGS. 3 and 8 reveal that under reverse bias, adjusting the thickness parameter $I_1$, can prohibit visible light from passing. As shown in the I-V chart, the ratio of light-current to dark-current must exceed $10^2$. The ratio unfavorably decreases under a forward bias.

This invention of involving amorphous silicon/amorphous silicon-germanium $NI_1PI_2N$, can be applied to light-pen based digital boards as follows.

(1) The difference between the two currents, derived from the positions of the light pen, is amplified. The design is clear and simple. The pixels are not required, and the design is cheap and practical.

(2) Currents are generated whenever a light spot is detected. The currents respond to the thin-membrane structure of the amorphous silicon PIN, that is by the photovoltaic effect of a solar cell, rather than by traditional effect of capacitors or the pressure-electric effect.

Light-pen based digital boards do not constrain the size of the screen, as do the traditional touch panels handwriting. Without contact points on the screen, it is durable over a long period of time. Also note that the built-in microswitch serves merely to enhance the tactile sense.

(3) The above mentioned idea can be applied to the "laser" light pen, by "remotely pointing" the pen at the screen, as follows the principle of the solar cell, such that the light pen and the screen can interact. The design embodies a completely novel idea.

TABLE 1

Conditions for developing this $NI_1PI_2N$ detector.

| | Pressure (torr) | Temperature (° C.) | Flow ratio (sccm) | RF power (W) | Growth Rate (A/min) |
|---|---|---|---|---|---|
| N layer | 0.75 | 250 | SiH$_4$:30 H$_2$:75 PH$_3$:30 | 25 | 167 |
| a-SiGe:H(1.65 eV) | 0.75 | 250 | SiH$_4$:18 H$_2$:130 GeH$_4$:2 | 25 | 176 |
| a-SiGe:H(1.42 eV) | 0.75 | 250 | SiH$_4$:8 H$_2$:140 GeH$_4$:2 | 25,500 Hz | 32 |
| Player | 0.75 | 250 | SiH$_4$:50 H$_2$:200 B$_2$H$_6$:200 | 25 | 218 |

The following claims are made:

1. A rollorphous silicon/amorphous silicon-germanium $NI_1PI_2N$ two dimensional position detector, comprising:

a front diode of $NI_1P$ that absorbs visible light; and a rear diode of $PI_2N$ that absorbs infrared light; the N material being selected from a group consisting of phosphorus-doped hydrogenated amorphous silicon and hydrogenated amorphous silicon germanium alloy; the P material being selected from a group consisting of boron-doped hydrogenated amorphous silicon and hydrogenated amorphous silicon-germanium alloy; the $I_1$ material being selected from a group consisting of undoped hydrogenated amorphous silicon and hydrogenated amorphous silicon-germanium alloy; the $I_2$ material being selected from a group consisting of undoped hydrogenated amorphous silicon-germanium alloy and hydrogenated amorphous germanium.

2. A 2-dimensional position detector, comprising:

a glass/infra-resistance layer ITO(1)/$NI_1PI_2N$/supra-resistance layer ITO(2)/Al structure;

two light-penetrating conductible membrane ITOs, as the infra-resistance layer and the supra-resistance layer of a divided circuit;

a front diode of $NI_1P$ to absorb visible light;

a rear diode of $PI_2N$ to absorb infrared light; and

Al electrodes that serve as contacts.

3. The position detector of claim 2, the material for the supra-resistance layer and the infra-resistance layer each being arbitrarily selected from the group consisting of ITO, TO, $\mu$c-Si and poly-Si.

4. A method of manufacturing $NI_1PI_2N$ infrared detectors, comprising the steps of:

depositing a conductible resistance membrane on a glass base;

then, depositing various layers selected from the group consisting of N, $I_1$, P, $I_2$ and N by modulating an RF plasma or continuous RF plasma with a pulsing square wave; and then depositing a supra-electrode layer.

5. The method of producing a glass/infra-resistance layer/$NI_1PI_2N$/supraresistance infrared position detector, comprising the steps of:

depositing an infra-resistance layer on a glass base; then depositing a layer of conductible resistance membrane;

depositing various layers selected from the group consisting of N, $I_1$, P, $I_2$ and N, in addition to depositing a supra-electrode layer, by modulating RF plasma or continuous RF plasma with a pulsing square wave;

then, depositing a supra-electrode layer; and finally, producing conductors for a supra-electrode and an infra-electrode by photoetching.

6. The method of claim 5, the material of the supra-resistance layer and the infra-resistance each being arbitrarily selected from the group consisting of ITO, TO, $\mu$c-Si and poly-Si.

* * * * *